United States Patent [19]
Sekimura et al.

[11] Patent Number: 4,675,534
[45] Date of Patent: Jun. 23, 1987

[54] OPTICAL READER WITH TWO SUBSTRATES

[75] Inventors: Nobuyuki Sekimura; Yuichi Masaki, both of Kawasaki; Katsunori Terada, Tokyo; Seiji Kakimoto, Yokohama, all of Japan

[73] Assignee: Canon Kabushiki Kaisha, Tokyo, Japan

[21] Appl. No.: 718,338

[22] Filed: Apr. 1, 1985

[30] Foreign Application Priority Data

Apr. 16, 1984 [JP] Japan .................................. 59-74910
Apr. 16, 1984 [JP] Japan .................................. 59-74913
Apr. 16, 1984 [JP] Japan .................................. 59-74914

[51] Int. Cl.$^4$ ............................................. H01J 40/14
[52] U.S. Cl. ..................................... 250/578; 358/293
[58] Field of Search ............... 250/200, 206, 555, 556, 250/208, 209, 216, 578; 355/1; 358/293

[56] References Cited
U.S. PATENT DOCUMENTS 4,546,243 10/1985 Hammo et al. ................. 250/578 X
4,564,766  1/1986 Kuroda et al. ..................... 250/578

Primary Examiner—Eugene R. LaRoche
Assistant Examiner—David Mis
Attorney, Agent, or Firm—Fitzpatrick, Cella, Harper & Scinto

[57] ABSTRACT

An optical reader includes a read-out section, driver circuit section, and wiring section for connecting the read-out section and the driver circuit section, wherein the read-out section and wiring section are respectively formed on separate substrates.

6 Claims, 8 Drawing Figures

OPTICAL READER WITH TWO SUBSTRATES

BACKGROUND OF THE INVENTION

1. Field of the Invention

The present invention relates to an optical reader, and more particularly relates to a reader having a characteristic structure of a read-out means.

2. Description of the Prior Art

Conventionally, a linear photodiode type elongated photosensor made of a silicon monocrystal has been used in a photoelectric conversion device which is used as a read-out means of an image processing apparatus, such as facsimile, and as a character reader. The photosensor of this type however has been restricted in its length and also has been manufactured with a low yield because of the available dimensions of silicon and manufacturing precision monocrystals. For this reason, in the case of a wide original to be read out (for instance, A4 size, of 210 mm width), an original image has been focussed as a scaled-down image onto a photosensor using an appropriate lens system. However, the introduction of such scaling-down optical system results in a hardship in miniaturizing the light reception section. In addition, since a sufficiently large light reception area (pixel area) can not be obtained for each pixel, a large amount of light has been required in order to obtain a sufficient signal current. Therefore, the photosensor as above under present conditions has been used for such read-out apparatuses as a low speed type reader with a longer read-out time, or a reader of which a high resolution is not required.

Apart from the above, recently, a photosensor using amorphous silicon has been proposed. This photosensor can be implemented by forming a thin layer of amorphous silicon using a vapor deposition method. Therefore, a large dimension photosensor or an elongated photosensor can readily be obtained. With the photosensor using amorphous silicon, even an original with a large width can be read out in the same scale, enabling one to realize a tight-contact type image sensor. Thus, miniaturization of the reader can be attained.

As driving methods for such readers, a direct drive method and a matrix drive method have been proposed. The matrix drive method uses a lesser number of drive ICs so that the reader can be manufactured with a low cost. FIG. 1 is a brief partial plan view of the circumference of a read-out section of a reader using a matrix drive method, and FIG. 2 is a cross sectional view along a line II—II of FIG. 1. In the figures, numeral 1 represents a substrate, numeral 2 represents an amorphous silicon photoconductive layer mounted on the substrate, numeral 3 represents common electrodes, and numeral 4-1 represents a separate electrodes. A gap portion at which each separate electrode 4-1 faces the common electrode 3 corresponds to a pixel portion (i.e., sensor portion). In the figures, the pixels are disposed in a 7×5 (=35) array. The pixels are divided into 7 blocks, each block including five pixels. The common electrodes 3 are respectively provided one for each block. The separate electrode 4-1 is at the opposite side of the sensor portion and is provided with an insulation layer 5. The insulation layer 5 is formed with a through hole 6 through which each separate electrode 4-1 of the block is connected to the corresponding one of five signal pick-up wires 7 mounted on the insulation layer 5. Therefore, the photosensor array can be driven in a matrix fashion by connecting to a driver circuit the seven terminals for the common electrodes 3 and five pick-up terminals for the pick-up wires.

With the matrix drive method, although it is possible to miniaturize the drive circuit section as described above, the structure of the wiring section becomes complicated. Although a photosensor with thirty-five pixels has been described with reference to FIGS. 1 and 2, in the case of an elongated photosensor having a high density of pixels, the number of pixels becomes 1728 for example. Therefore, the structure of a multi-layer wiring section becomes quite complicated.

In conventional readers of this kind, as shown in FIGS. 1 and 2, since the read-out section and the multi-layer wiring section for matrix connection have been formed on the same substrate, the manufacturing yield of the reader equals the manufacturing yield of the read-out section multiplied by the manufacturing yield of the wiring section. As a result, the manufacturing yield of the reader of this kind has been very low, thus resulting in a high cost in manufacturing.

SUMMARY OF THE INVENTION

In view of the above prior art, it is an object of the present invention to improve the manufacturing yield of the read-out section of an optical reader and to reduce the manufacturing cost of the reader.

This object according to the present invention, by providing an optical reader comprising a read-out section, driver circuit section, and a wiring section for connecting the read-out section and driver circuit section, wherein the read-out section and wiring section are respectively formed on separate substrates.

DETAILED DESCRIPTION OF THE PREFERRED EMBODIMENTS

The preferred embodiments of the present invention will now be described with reference to the accompanying drawings.

Figure 1:
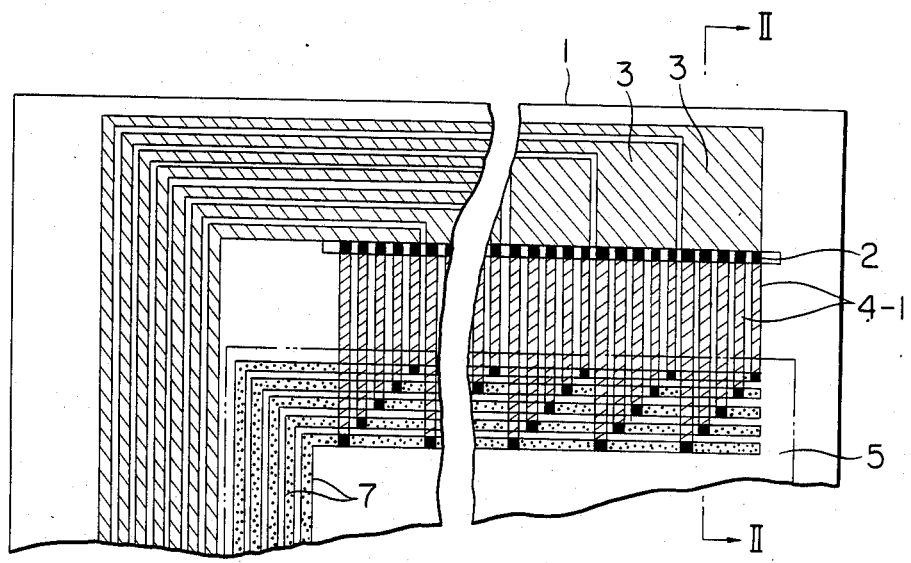
FIG. 1 is a partial plan view of a circumference of a read-out section of a prior art reader.
Figure 2:
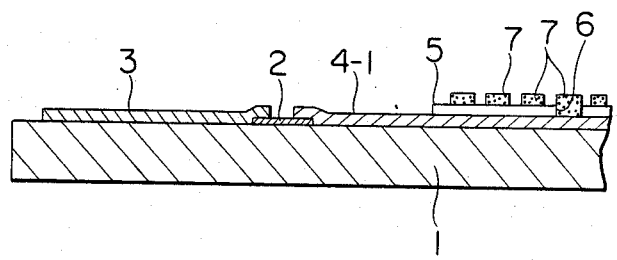
FIG. 2 is a cross section along line II—II of FIG. 1.
Figure 3:
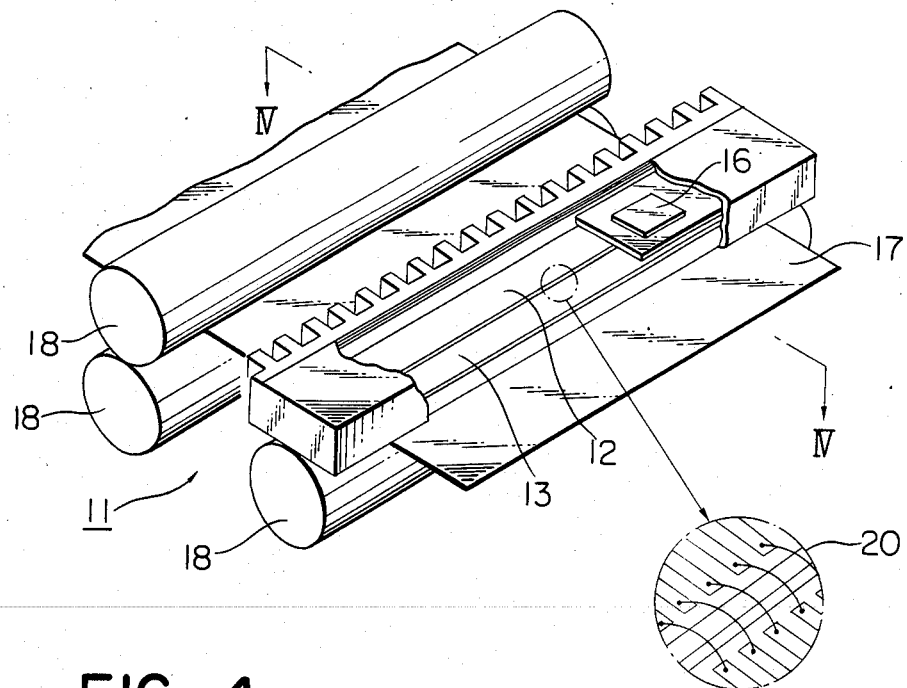
FIG. 3 is a partial perspective view, broken out in part, of a reader according to the present invention.
Figure 4:
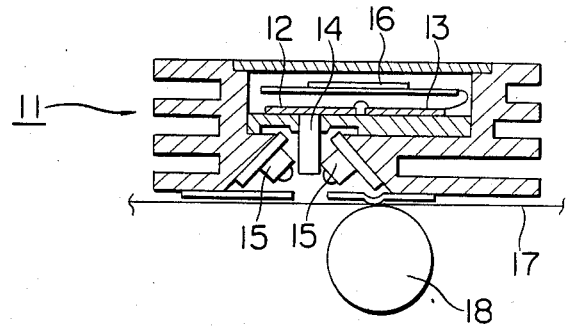
FIG. 4 is a cross section along line IV—IV of FIG. 3.

FIG. 3 is a partial perspective view cut away in part showing briefly an optical reader according to an embodiment of the present invention, and FIG. 4 is a cross section taken along the line IV—IV of FIG. 3. In the figures, numeral 11 represents a read-out section of the reader on which an elongated first substrate 12 and elongated second substrate 13 are mounted. Beneath the first substrate 12 is mounted a convergent optical transmission body array 14 made of such as a fiber lens array. A respective LED array 15 is mounted to each side of the optical transmission body array 14. A read-out sensor section, that is an amorphous silicon photoconductive layer or the like, and common and separate electrodes connected to the photoconductive layer are formed on the first substrate 12. A multi-layer wiring section connected to the common and separate electrodes on the first substrate 12 is formed on the second substrate 13. The structure of the multi-layer wiring section is the same as described with respect to FIGS. 1 and 2. The electrical connection between the read-out section on the first substrate 12 and the wiring section on the second substrate 13 is carried out using an aluminum bonding wire 20. Numeral 16 represents a driver circuit section electrically connected to the wiring section. The connection may be carried out using flexible and electrically conductive material. Numeral 17 represents an original or other member to be read, and numeral 18 represents feeder rollers for the original.

Figure 5:
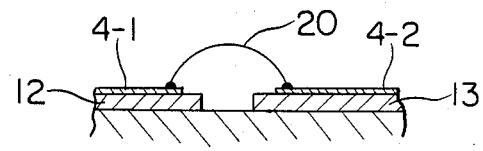
FIG. 5 is an enlarged partial view of FIG. 4.

FIG. 5 is an enlarged partial view of FIG. 4. In this embodiment, the first and second substrates 12 and 13 have substantially the same thickness. The separate electrodes 4-1 are formed on the first substrate 12, while on the second substrate 13 electrode wiring 4-2 connected to the separate electrodes 4-1 at the side of the first substrate 12 are formed. Since the substrates 12 and 13 have substantially the same thickness, the bonding work for the electrical connection using the bonding wire 20 can be performed easily and certainly, thereby improving the reliability of electrical connection.

Figure 6:
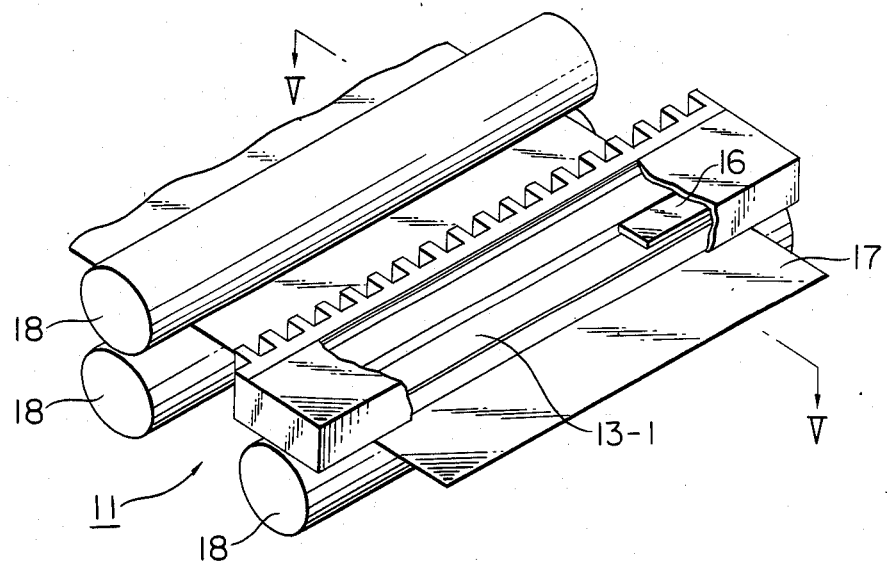
FIG. 6 is a partial perspective view, broken out in part, of a reader according to another embodiment of the present invention.
Figure 7:
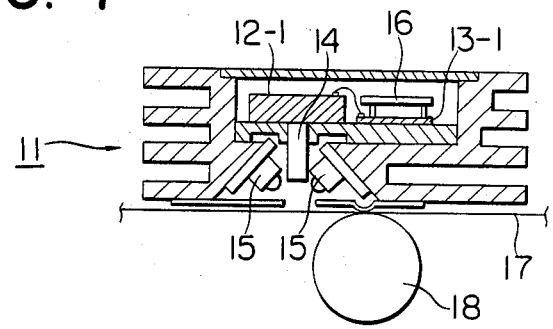
FIG. 7 is a cross section along line V—V of FIG. 6.

FIG. 6 is a partial perspective view cut away in part showing briefly an optical reader according to another embodiment of the present invention, and FIG. 7 is a cross section taken along the line V—V of FIG. 6. In the figures, numeral 11 represents a read-out section of the reader on which an elongated first substrate 12-1 and an elongated second substrate 13-1 disposed parallel to the first substrate 12-1, are mounted. Beneath the first substrate 12-1, a fiber lens array 14 is mounted. An LED array 15 is mounted on both sides of the fiber lens array 14. A read-out sensor section, e.g., an amorphous silicon photoconductive layer, and common and separate electrodes connected to the photoconductive layer are formed on the first substrate 12-1. A multi-layer wiring section connected to the common and separate electrodes on the first substrate 12-1 is formed on the second substrate 13-1. The structure of the multi-layer wiring section is the same as described with reference to FIGS. 1 and 2. The electrical connection between the read-out section on the first substrate 12-1 and the wiring section on the second substrate 13-1 is carried out using an aluminum bonding wire 20. Numeral 16 represents a driver circuit section electrically connected to the wiring section. The connection may be carried out using flexible and electrically conductive material. Numeral 17 represents an original or other member to be read out, and numeral 18 represents feeder rollers for the original.

Figure 8:
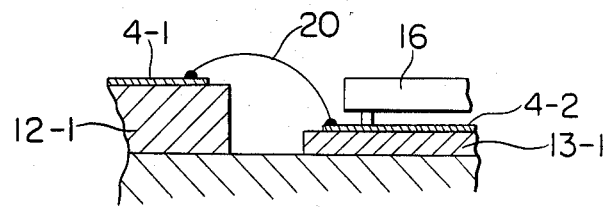
FIG. 8 is an enlarged partial view of FIG. 7.

FIG. 8 is a partially enlarged view of FIG. 7. In this embodiment, the first substrate 12-1 has a greater thickness than that of the second substrate 13-1. The separate electrodes 4-1 are formed on the first substrate 12-1, while on the second substrate 13-1 electrode wiring 4-2 connected to the separate electrodes 4-1 at the side of the first substrate 12-1 is formed. Since the second substrate 13-1 is thinner than the first substrate 12-1, it is possible to mount the driver circuit section 16 above the second substrate 13-1, thereby enabling an effective use of space.

In the above embodiments, although the electrical connection between the read-out section and wiring section has been carried out using an aluminum bonding wire, the electrical connection in the reader of the present invention may be performed using other suitable means, for example, using flexible and electrically conductive material such as heat seal and tape carrier.

In the above embodiment, although the first substrate has been described as thicker than the second substrate, it is possible on the contrary to make the second substrate thicker than the first substrate. In this case, the driver circuit section can be disposed above the first substrate.

Effects of the Invention

According to the present invention, the read-out section and wiring section of the reader can be manufactured independently and those sections of good quality, only, can be used in fabrication. Therefore, good performance in manufacturing is obtained and the manufacturing yield is improved. Moreover, the read-out and wiring sections can be mass-produced independently from each other. Therefore, it is possible to reduce the manufacturing cost. In addition, according to the reader of the present invention, if any trouble in either the read-out section or the wiring section occurs, the repair can readily be made merely by replacing the substrate where the trouble has occurred. Also, according to one example of the readers of the present invention, since the substrates for the read-out and wiring sections are different in thickness from each other, other circuit units such as a driver circuit section may be disposed above the thinner substrate, thus improving the degree of freedom in fabrication.

What is claimed is:

1. An optical reader comprising a read-out section, a driver circuit section, and a wiring section for connecting said read-out section and said driver circuit section, wherein said read-out section and said wiring section are respectively formed on separate substrates.

2. An optical reader according to claim 1, wherein each of said substrates has substantially the same thickness.

3. An optical reader according to claim 1, wherein each of said substrates has a different thickness.

4. An optical reader according to claim 1, wherein said read-out section includes an amorphous photoconductive layer, and a plurality of separate and common electrodes electrically connected to said photoconductive layer.

5. An optical reader comprising: an LED array light source; a light reception element array; a convergent optical transmission body array for convergently transmitting light which has been output by said light source and which has been radiated through a member to be read; a driver circuit section; and a wiring section for connecting said light reception element array and said driver circuit section, wherein said light reception element array and said wiring section are respectively formed on separate substrates.

6. An optical reader according to claim 5, wherein said light reception element array includes an amorphous photoconductive layer as a light reception element.

* * * * *